United States Patent
Zilic et al.

[11] Patent Number: 6,124,732
[45] Date of Patent: Sep. 26, 2000

[54] SIGNALING VOLTAGE RANGE DISCRIMINATOR

[75] Inventors: Zeljko Zilic; Ho T. Nguyen; Gary P. Powell, all of Allentown; William B. Andrews, Long Pond; Richard G. Stuby, Jr., New Tripoli, all of Pa.

[73] Assignee: Lucent Technologies, Inc., Murray Hill, N.J.

[21] Appl. No.: 09/115,683

[22] Filed: Jul. 15, 1998

[51] Int. Cl.[7] .............................................. H03K 19/0175
[52] U.S. Cl. ................................ 326/63; 326/63; 326/80; 327/77
[58] Field of Search .................................... 326/37, 38, 33, 326/47, 49, 80, 81, 83, 86; 327/50, 58, 63, 64, 68, 70, 77, 74, 76, 78, 99, 80, 81, 82

[56] References Cited

U.S. PATENT DOCUMENTS

| | | |
|---|---|---|
| 4,429,234 | 1/1984 | Streit . |
| 4,710,793 | 12/1987 | Gray . |
| 4,970,412 | 11/1990 | Jarrett . |
| 5,051,611 | 9/1991 | Kantz . |
| 5,121,004 | 6/1992 | Kesler et al. . |
| 5,319,265 | 6/1994 | Lim . |
| 5,323,067 | 6/1994 | Shay . |
| 5,341,045 | 8/1994 | Almulla ................................ 307/475 |
| 5,343,086 | 8/1994 | Fung et al. ......................... 307/296.1 |
| 5,532,521 | 7/1996 | Seo et al. ................................. 326/81 |
| 5,943,635 | 8/1999 | Inn .......................................... 702/60 |
| 5,973,521 | 10/1999 | Kim et al. .............................. 327/112 |

*Primary Examiner*—Michael Tokar
*Assistant Examiner*—Anh Tran
*Attorney, Agent, or Firm*—Dickstein Shapiro Morin & Oshinsky LLP

[57] ABSTRACT

The invention provides an input/output (I/O) signaling voltage range discriminator (and corresponding method) which is used to control a configurable logic device such as a configurable I/O buffer in a second electronic circuit in response to a detected signaling voltage range of a first electronic circuit. The discriminator outputs an indication of the signaling voltage range of the first electronic circuit to a configurable I/O buffer enabling it to adapt to the signaling levels used by the first electronic circuit. The I/O buffer, based on the indication provided by the discriminator, can then configure its logic to become tolerant and/or compatible with digital signals transferred to and from the first electronic circuit.

35 Claims, 4 Drawing Sheets

SIGNALING VOLTAGE RANGE DISCRIMINATOR

BACKGROUND OF THE INVENTION

1. Field of the Invention

The invention relates to the field of signal communications between electronic circuits. More specifically, the invention is directed to a versatile input/output (I/O) buffer for interfacing one electronic circuit with other electronic circuits which may be operating with different power supply levels and/or signaling voltage ranges.

2. Description of Prior Art

Any given electronic circuit or component in the modern age is often required to communicate with a wide variety of other electronic circuits or components which have different power supply levels and/or signaling voltage ranges.

Several prior art attempts have been made to accommodate the different signal voltage ranges encountered when interfacing different electronic circuits. One such attempt provides separate I/O buffers for each signaling voltage range that is likely to be used by external circuits. As shown in FIG. 4a, for example, it is known to provide separate I/O buffers 40, 42 for use with the same input/output terminal (shown as "pad 44") of a field programmable gate array (FPGA) 18 integrated circuit (IC) which connects with external circuits or components 21. It should be understood that the FPGA is merely illustrative of just one type of circuit which may be required to interface with other electronic circuits or components.

As is well known in the art, some I/O buffer circuits utilize separate buffers for input and output stages, whereas others integrate the two functions into a single buffer circuit. The FPGA 18 illustrated in FIG. 4a is configured for use with external circuits or components 21 utilizing one of two different signaling voltage ranges having upper voltages rated at 3.3 volts (V) and 5 V. To the extent that any electronic circuit or component used with the FPGA 18 utilizes a 5 V signaling voltage range, the I/O 5 V buffer 40 is used to couple that electronic component to the FPGA's pad 44. To the extent that an electronic component utilizes a 3.3 V signaling voltage range, the I/O 3.3 V buffer 42 would be used to couple that electronic component to the pad 44.

Another prior art I/O buffer circuit, shown in FIG. 4b, is capable of supporting and tolerating different signaling voltage ranges of external components. To the extent that a 5 V signaling voltage range-based electronic component is used with the FPGA, the configurable I/O buffer 46 is configured to accept or output signals compatible with the 5 V environment of the electronic component. To the extent that the electronic component uses a 3.3 V signaling voltage range scheme, the I/O buffer 46 is configured to accept or output signals compatible with the 3.3 V environment of the electronic component. In order to discriminate between the different power supply levels and/or signaling voltage ranges in the particular electronic component used with the FPGA, a memory cell 48, e.g., a RAM cell (as shown in FIG. 4b) or ROM cell, is provided to store and output a voltage designation bit identifying the signaling voltage range used in the electronic component. Based on this identification bit, the I/O buffer 46 is configured to accept or output either 5 V or 3.3 V-based signals accordingly.

In both systems described above, the operating voltage range of the electronic component attached to the input of the I/O buffer must be known in advance. For example, in the dual I/O buffer arrangement, shown in FIG. 4a, the user must know the pertinent operating signaling voltage range to determine which one of the two I/O buffers 40, 42 should be connected to pad 44. Similarly, in the FIG. 4b single buffer arrangement, the user must know the operating signaling voltage range of the electronic component in advance in order to store the correct designation bit in memory cell 48. These proposed solutions thus have no capability of adapting the I/O buffer to an electronic component which has a signaling voltage range which is unknown prior to attachment to the FPGA system.

SUMMARY OF THE INVENTION

The invention provides an input/output (I/O) signaling voltage range discriminator (and corresponding method) which is used to control a configurable logic device, for example, a configurable I/O buffer in a second electronic circuit in response to a detected signaling voltage range of a first electronic circuit. In most digital circuits the digital signaling level varies or ranges between the low and high operating supply voltage levels, e.g., 0→3.3 V or 0→5 V. Accordingly, the operating voltage represents the level of the signaling voltage. However, the invention would also be used to configure circuits and/or components to adapt to different power supplies as well.

The discriminator outputs an indication of the signaling voltage range of the first electronic circuit to a configurable I/O buffer enabling it to adapt to the signaling levels used by the first electronic circuit. The I/O buffer, based on the indication provided by the discriminator, can then configure its logic to become tolerant and/or compatible with digital signals transferred to and from the first electronic circuit.

In a preferred embodiment of the invention, the second electronic circuit is a programmable logic device and the discriminator performs its signaling voltage range detection operation during a programming phase of the logic device. During normal operational use of the programmed logic device, no discrimination operation is performed, and thus, no power needs to be consumed by the discriminator.

DETAILED DESCRIPTION OF PREFERRED EMBODIMENTS

The invention will be described in detail with reference to the preferred embodiments illustrated in FIGS. 1a, 1b, 2 and 3. The invention is described herein in its preferred application to an operational circuit which has a field programmable gate array (FPGA) 18 (FIGS. 1a, 1b) interfaced with one of a plurality of electronic components or circuits that operate with different voltage signaling levels (e.g., 3.3 V, 5 V, etc.). However, the invention may be applicable to any type or configuration of component, circuit or interface between electronic circuits (e.g., static random access memory (SRAM), read only memory (ROM), microprocessor, etc.) which may have different signaling levels and/or power supply voltages. Also, although the preferred embodiment of the invention is described herein as monitoring the power supply voltage of an external circuit 21 because it is representative of the digital signaling levels used by the external circuit and it is convenient to do so, the invention could detect the signaling level used in other ways such as directly monitoring the digital signals output by the external circuit 21, as will be described below.

Figure 1A:
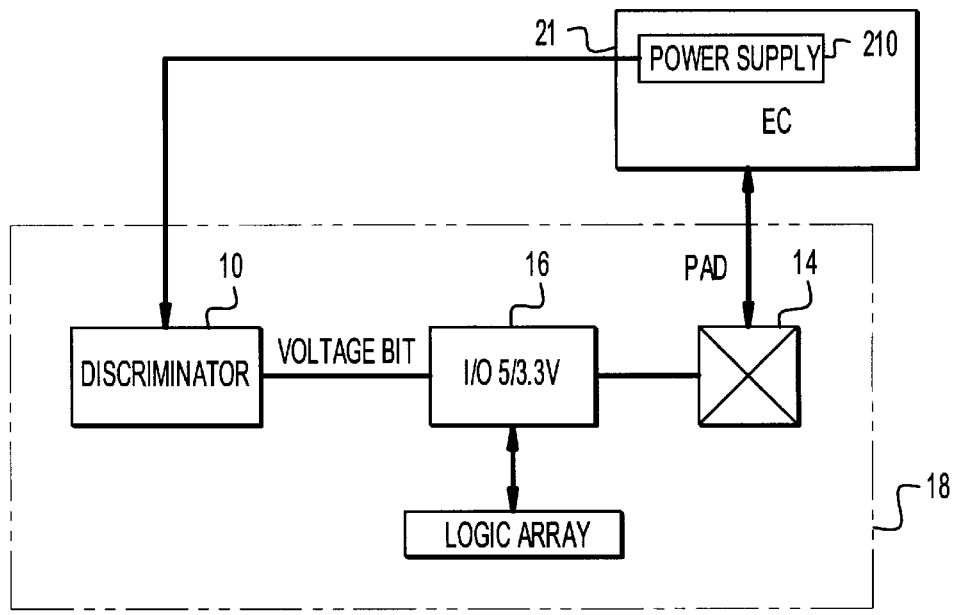
FIGS. 1a and 1b illustrate in block diagram form a preferred embodiment of the invention used in conjunction with a configurable input/output (I/O) buffer.

As shown in FIG. 1a, the invention provides, as part of field programmable gate array (FPGA) 18, a voltage discriminator 10 coupled at one end to an external electronic component/circuit (EC) 21 (external to FPGA 18). The voltage discriminator 10 is connected at another end to configurable input/output (I/O) buffer 16. External circuit 21 is intended to be used in a system with FPGA 18, however, the precise signaling levels used by EC 21 is not known prior to attachment (directly or indirectly, e.g., through an electronic bus structure) to FPGA 18. As noted above, with other known systems, the configurable I/O buffer 16 could not be used to provide the proper connection to FPGA 18, as the signaling voltage levels (e.g., either based on 3.3 V or 5 V) of the I/O buffer 16 could not be configured in advance without prior knowledge of the signal levels to be supplied by EC21.

In accordance with a preferred embodiment of the invention, voltage discriminator 10 receives as an input the unknown signaling voltage Vpp representative of the signaling voltage range used by EC 21. The unknown signaling voltage Vpp is input to discriminator 10 from one of a variety of sources. For example, in one preferred embodiment, the unknown signaling voltage Vpp is taken directly from the unknown power supply 210 used to power EC 21, as shown in FIG. 1a. In another embodiment, the unknown signaling voltage Vpp is taken from a circuit (not shown), e.g., a signal peak detector, that directly measures the signal levels of data signals output from EC 21 to pad 44 of FPGA 18. It should be readily apparent that any number of alternative sources may be used to produce an input voltage Vpp representative of the signaling voltage range used by EC 21.

Once voltage Vpp is input, voltage discriminator 10 can then determine what signaling voltage range (e.g., 3.3 V or 5 V) is used by EC 21. Once the signaling voltage range is determined, a voltage identifying signal (preferably, in the form of a single bit) identifying the signaling voltage range of the EC 21 is sent to configurable I/O buffer 16. Configurable I/O buffer 16 can then configure itself to operate in conjunction with pad 14 of FPGA 18 in accordance with the proper voltage (e.g., 3.3 V or 5 V) environment. One example of how a buffer may configure itself upon receiving the voltage identifying bit includes a substrate voltage bias circuit that biases a P-channel transistor substrate of the buffer to correspond to the appropriate signaling environment (e.g., 3.3 V or 5 V) used by an external circuit that is in communication with the buffer. Biasing the P-channel transistor substrate in this manner in response to an identification of the appropriate signaling environment effectively configures the buffer to the proper signaling environment used by the external circuit to allow transfer of data signals and other information between the external circuit and the buffer. Any number of alternative techniques of configuring I/O buffer 16 (or any other configurable devices) to be tolerant or compliant with one of a multiple number of signaling voltage ranges may be used in conjunction with the invention.

By utilizing the invention in conjunction with such a configurable device, FPGA 18 is provided with the capability of configuring the I/O buffer logic at the time the system is working (i.e., EC 21 is connected to the system with FPGA 18) and the ability to configure the I/O buffer in accordance with the actual signaling voltage range used by EC 21.

Figure 1B:
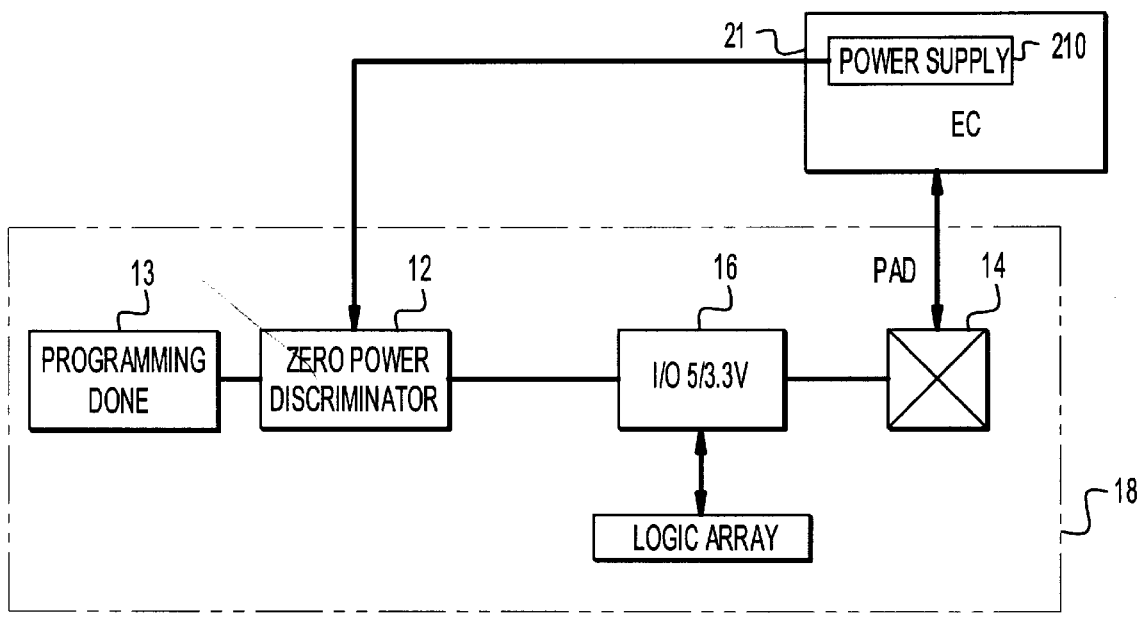

In another preferred embodiment, a zero power voltage discriminator 12 is provided in FPGA 18, as shown in FIG. 1b. As in the previous embodiment described above, zero power discriminator 12 is coupled to both EC 21 and configurable I/O buffer 16, and operates in substantially the same manner. Zero power discriminator 12, however, consumes no power in the active mode of FPGA 18. Instead, it performs the voltage discrimination of the unknown signaling voltage range only during programming of FPGA 18. To this end, a "Programming Done" signal, preferably output from a controller or signal generator 13 on FPGA 18, is provided to zero power discriminator 12 to enable/disable the voltage discrimination function performed in the zero power discriminator 12.

In this preferred embodiment, during programming of FPGA 18, the "Programming Done" signal signifies (e.g., with a LOW state) that FPGA 18 is in the process of being programmed. Once the programming of FPGA 18 is completed, the "Programming Done" signal input signifies (e.g., with a HIGH state) the termination of the programming operation. This latter signal input is effective to disable operation of the zero power discriminator 12. Any voltage identifying bit issued by zero power discriminator 12 would have been sent (or made available for input) to configurable I/O buffer 16 prior to reception of this latter signal input, and the configurable I/O buffer 16 could then be configured accordingly, in the manner described above.

Figure 2:
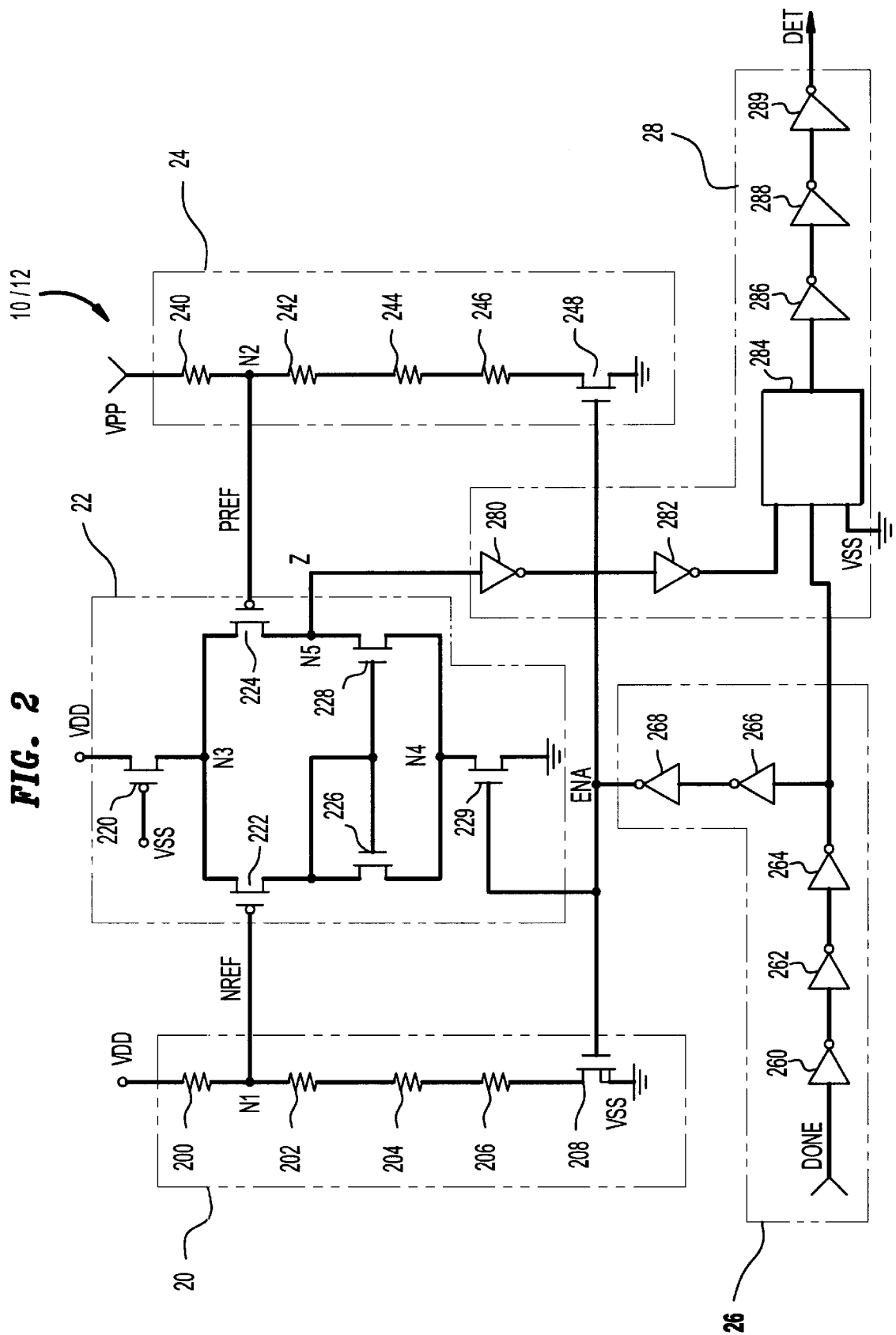
FIGS. 2 and 3 schematically illustrate preferred embodiments of the invention employing a signal comparator in the form of a differential amplifier.

A more detailed illustration of a preferred embodiment of the voltage discriminator 10/12 (i.e., either voltage discriminator 10 or zero power discriminator 12) of the invention is shown in FIG. 2. In the voltage discriminator illustrated, a first voltage reference generator 20 is provided to generate a reference voltage (e.g., 3.3 V) that will be used in the discrimination process to determine the unknown signaling voltage Vpp representative of the unknown signaling voltage range used by EC 21. Although many different circuit arrangements are envisioned as usable, one of the preferred arrangements involves a series connection of four resistors 200, 202, 204 and 206, with the reference voltage NREF output from a node N1 connecting in series resistors 200 and 202. At least with respect to discriminator 12 (FIG. 1b), the four resistor series connection is terminated by transistor 208 whose gate is controlled, in this embodiment, by enable signal ENA. As with most of the components of voltage discriminator 10/12, first voltage reference generator 20 is controlled by the state of enable signal ENA. When implementing discriminator 10 (FIG. 1a), it should be readily apparent that enable signal generator 26 is omitted, or alternatively, maintained in a constant "enabled" state.

This enable signal ENA is output from enable signal generator 26, which, in the embodiment of FIG. 1b, is activated only when FPGA 18 is being programmed and when the "Programming Done" signal signifies (e.g., through a LOW state signal input) that the programming operation is occurring. Although many different configurations may be employed, the preferred arrangement for enable signal generator 26 is shown having a series connection of buffer/inverters 260, 262, 264, 266 and 268, whose ENA signal output is connected to voltage reference generator 20, signal comparator 22, and unknown signaling voltage generator 24. (Output latch device 28 receives a similar output from a series connection of buffer/inverters 260, 262 and 264.)

Voltage reference generator 24 is used to supply a voltage representing the unknown signaling voltage Vpp. As noted above, multiple sources (not shown) may be used to supply signal Vpp such as power supply 210, data signal input level detection circuitry, or any other circuit or component known to be used in determining the operating signaling voltage range used in a circuit such as EC 21. Unknown signaling voltage generator 24 receives as an input voltage Vpp as a signal representative of the unknown signaling voltage range used in EC 21 and provides the representative voltage as an output signal PREF.

Similar to the preferred construction of voltage reference generator 20, unknown signaling voltage generator 24 is preferably made up of a series connection of resistors 240, 242, 244 and 246, with the voltage reference PREF being output from a node N2 connecting in series resistors 240 and 242. The four resistor series connection is also terminated by an enabled transistor, transistor 248, whose gate is controlled by enable signal ENA.

In accordance with the invention, reference voltage NREF is compared to voltage level PREF in signal comparator 22, and an output signal Z is issued in response to the comparison. In the preferred embodiment, signal comparator 22 includes a differential amplifier having two branches with complementary pairs of transistors 222, 226 and 224, 228 used to compare voltages NREF and PREF. It is understood, however, that any one of a variety of known comparators may be used in practicing the invention. As shown in FIG. 2, a first pair of the complementary transistors is made up of P-channel transistor 222 and N-channel transistor 226 coupled in series between power supply source Vdd (connected through node N3 and transistor 220) and node N4. A second pair of transistors formed by P-channel transistor 224 and N-channel transistor 228 are coupled in series between power supply source Vdd and node N4, as well. The voltage reference signal NREF from reference voltage generator 20 controls the gate input of P-channel transistor 222. The drains of transistors 222 and 226 are coupled together and are also coupled to the gates of transistors 226 and 228. The input voltage signal from unknown signaling voltage generator 24 controls the gate input of P-channel transistor 224. The drains of transistors 224 and 228 are coupled together at node N5 and provide the comparator output signal Z. An N-channel transistor 229 is coupled between node N4 and Vss, which is shown as a ground potential (0 Volts) in this illustration. The gate of transistor 229 is tied to enable signal ENA, which is output from enable signal generator 26, as discussed above.

In performing the comparison between NREF and PREF in signal comparator 22, the power supply voltage level Vdd of discriminator 10/12 is assumed to be nominally 3.3 volts, and Vss is assumed to be ground. Transistor 220, operating as an enabling transistor, is normally active where Vdd is higher than the Vss ground potential such that a voltage level Vdd appears at node N3. Because the voltage level NREF, which is a voltage divided output derived from power supply voltage Vdd, is less than node N3 voltage of Vdd, transistor 222 is activated to place the Vdd voltage on the gate terminals of transistors 226 and 228. Assuming that enable signal ENA activates transistor 229, i.e., during programming of FPGA 18 (for purposes of discriminator 12), transistor 228 is activated by input voltage Vdd. Based on the voltage level of input signal PREF, which is a voltage divided output derived from unknown signaling voltage Vpp, the voltage appearing at node N5 will be output as the comparator output signal Z. In particular, comparator output signal Z will be clamped to a ground (Vss) potential through transistor 228 when PREF is greater (e.g., 5 V) than NREF, as transistor 224 is inactive. Comparator output signal Z will be set to Vdd through activation of transistor 224 when PREF is the same or less (e.g., 3.3 V or less) than NREF.

Comparator output signal Z is input to latching device 28 for storage and output as a voltage identifying bit to the configurable I/O buffer of the FPGA 18. Latching device 28 includes a pair of serially connected input buffer/inverters 280, 282, which pair is connected also in series with bit latch 284. Latch 284 may be any generic latch, a specialized latch (e.g., transparent latch, a level sensitive latch, etc.), or any other known temporary storage or hold device, circuit or component used to supply an output signal for use by downstream circuit components. The voltage identifying bit (i.e., comparator output signal Z) is then stored in latch 284 and output to the configurable I/O buffer in the FPGA 18 through three output buffer/inverters 286, 288 and 289 connected in series. For example, where comparator output signal Z is clamped to Vss (i.e., when PREF is greater (e.g., 5 V) than NREF), the voltage identifying bit DET will be HIGH after passing through buffer/inverters 280, 282, latch 284, and buffer/inverters 286, 288 and 289. However, where comparator output signal Z is set to Vdd (i.e., when PREF is the same or less (e.g., 3.3 V or less) than NREF), the voltage identifying bit DET will be LOW. As noted above, the configurable I/O buffer can use this voltage identifying bit to configure its logic in order to interface properly with the electronic component at the detected signaling voltage range.

Figure 3:
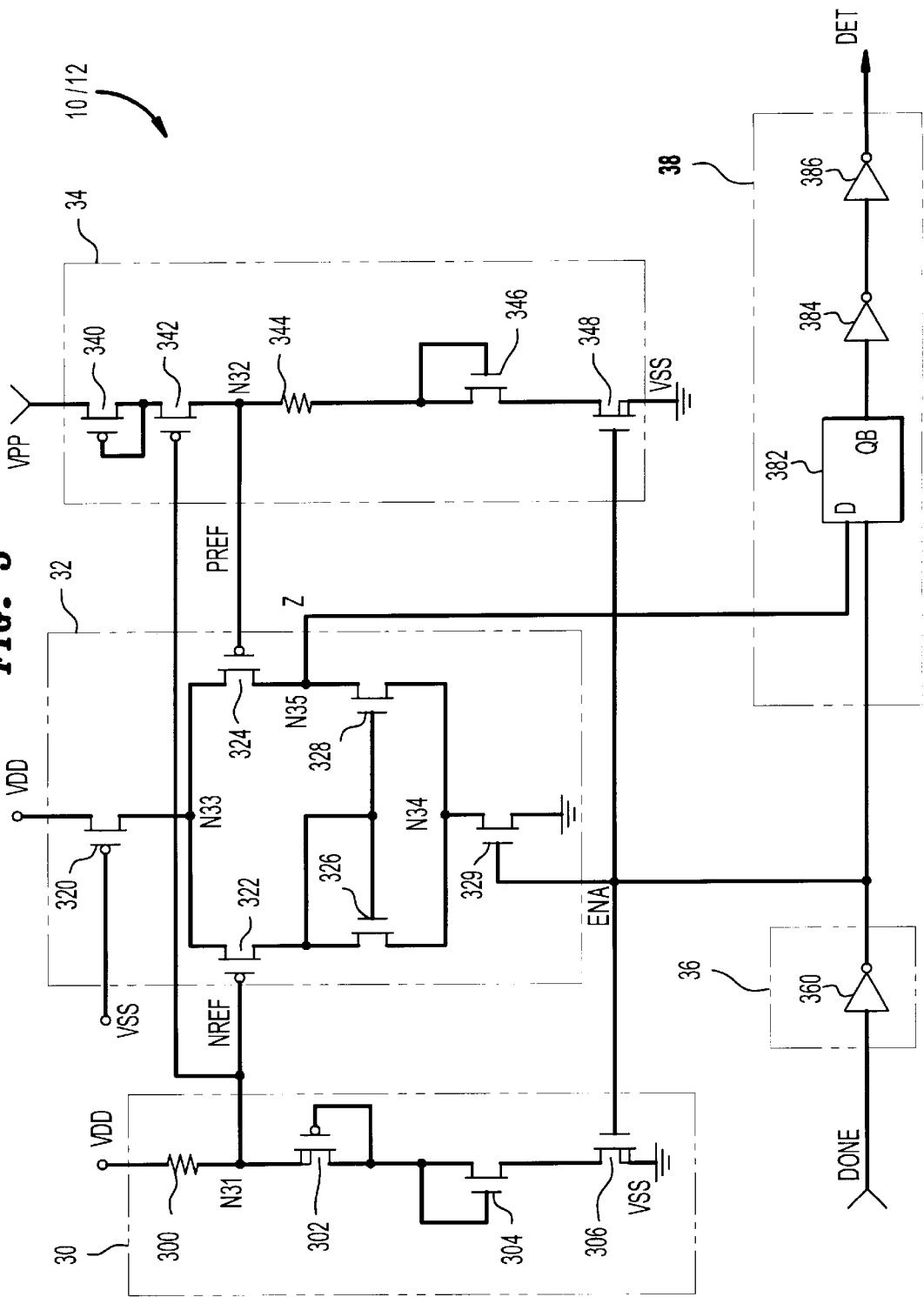
Figure 4A:
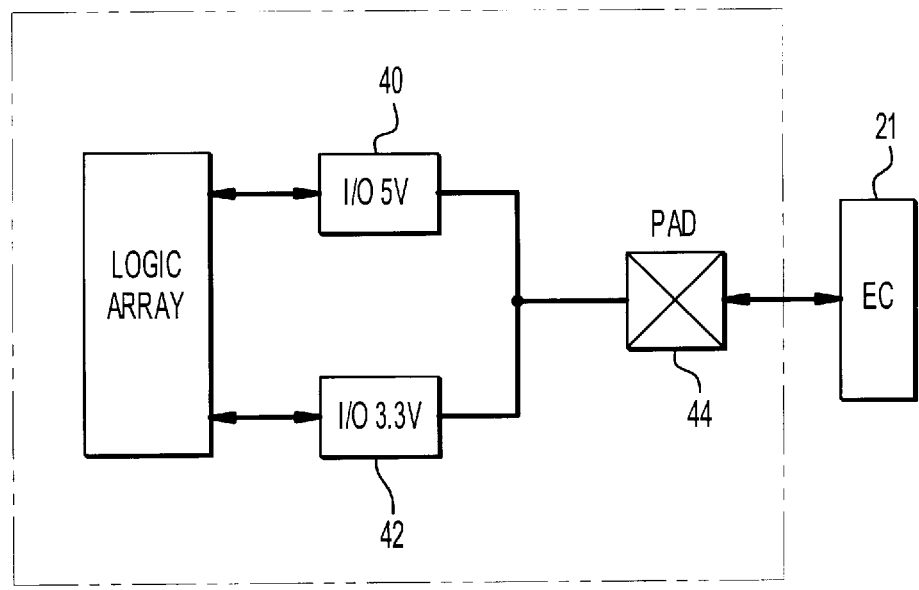
FIG. 4a illustrates a known dual I/O buffer arrangement.
Figure 4B:
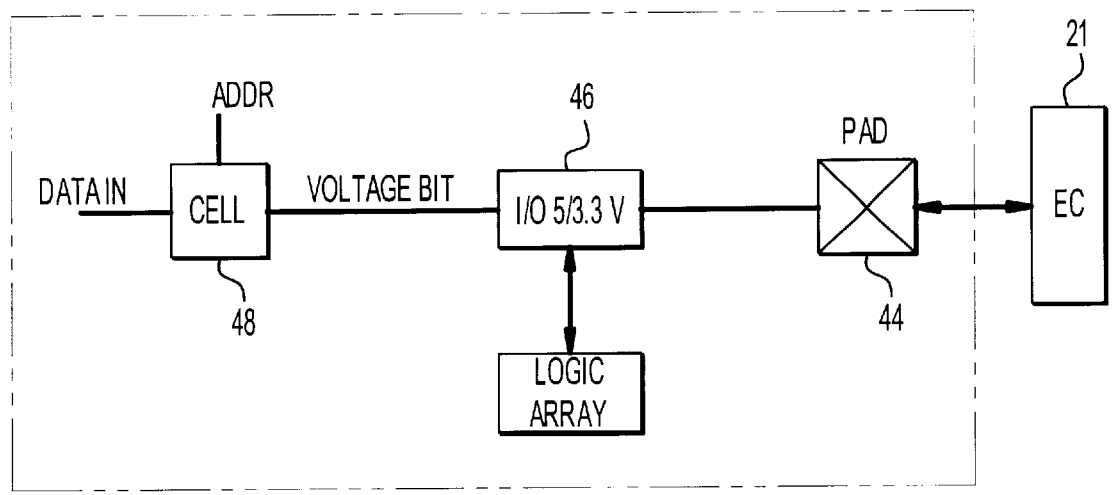
FIG. 4b illustrates a known single I/O buffer arrangement.

FIG. 3 illustrates another voltage discriminator 10/12 which may be used in the invention. Voltage reference generator 20, signal comparator 22, unknown signaling voltage generator 24, enable signal generator 26, and latching device 28, shown in FIG. 2, are respectively replaced in FIG. 3, with voltage reference generator 30, signal comparator 32, unknown signaling voltage generator 34, enable signal generator 36, and latching device 38. Voltage reference generator 30 derives a reference voltage NREF from the power supply voltage Vdd of the FPGA using a series connection of resistor 300, P-channel transistor 302, N-channel transistor 304, and N-channel transistor 306. The NREF voltage is output from node N31 connecting resistor 300 to the drain of transistor 302. In this preferred embodiment both transistors 302 and 304 have their gates and drains tied to one another to form, in effect, a series connection of two diodes between node N31 and transistor 306. Transistor 306 is connected between Vss and transistor 304, with its gate controlled by enable signal ENA. The use of resistor 300 and transistors 302, 304 is to reduce the effects of the variation of supply voltage Vdd, which may typically vary between 3.0 V and 3.6 V.

Enable signal generator 36, in this preferred embodiment, contains a buffer/inverter 360 that generates an enable signal to turn on transistors 306, 348 and 329 and thereby activate voltage reference generator 30, signal comparator 32, and unknown signaling voltage generator 34, respectively. The enable signal ENA also activates latching device 38. The enable signal ENA is generated, as in the prior embodiment (at least for discriminator 12), during programming of the FPGA, as represented by the "Programming Done" signal input to enable signal generator 36 (discussed above).

As in FIG. 2, in the preferred embodiment of FIG. 3, signal comparator 32 includes a differential amplifier having two branches with complementary pairs of transistors 322, 326 and 324, 328 used to compare voltages NREF and PREF. A first pair of the complementary transistors is made up of P-channel transistor 322 and N-channel transistor 326 coupled in series between power supply source Vdd (connected through node N33 and transistor 320) and node N34. A second pair of transistors formed by P-channel transistor 324 and N-channel transistor 328 are coupled in series between power supply source Vdd and node N34, as well. The voltage reference signal NREF from reference voltage generator 30 controls the gate input of P-channel transistor 322. The drains of transistors 322 and 326 are coupled together and are also coupled to the gates of transistors 326 and 328. The input voltage signal from unknown signaling voltage generator 34 controls the gate input of P-channel transistor 324. The drains of transistors 324 and 328 are coupled together at node N35 and provide the comparator output signal Z. An N-channel transistor 329 is coupled between node N34 and Vss, which is shown as a ground potential in this illustration. The gate of transistor 329 is tied to enable signal ENA, which is output from enable signal generator 36, as discussed above.

Unknown signaling voltage generator 34 is preferably made up of a series connection of P-channel transistors 340, 342, resistor 344, and N-channel transistors 346, 348. Transistors 340 and 346, preferably, have their gate terminals tied to their drain terminals effectively converting them into diodes. Unknown signaling voltage generator 34 generates as an output voltage signal PREF appearing at node N32 formed by connection of the drain of transistor 342 and one terminal of resistor 344. The gate of P-channel transistor 342 is controlled by the voltage level NREF output from voltage reference generator 30 to operate as a threshold check. That is, the voltage level at node N32 will follow Vpp once Vpp is greater than a threshold voltage level substantially equal to the NREF output from voltage reference generator 30.

Latching device 38 receives enable signal ENA and passes this signal to latch 382. The enable signal functions as a clocking signal to clock the input data appearing as signal Z (output from signal comparator 32) into latch 382 and presents as an output the signal Z to buffers 384 and 386. The output signal Z is issued as signal DET after passing through the serially connected buffer/inverters 384 and 386. The DET signal represents the signaling voltage range used in EC 21, as detected by signal comparator 32. This DET signal can then be used by the configurable I/O buffer to configure its logic to accept signals from EC 21 using the appropriate voltage level.

As with the prior embodiment, in performing the comparison between NREF and PREF using the signal comparator 32 shown in FIG. 3, the power supply voltage level Vdd of discriminator 10/12 is assumed to be nominally 3.3 volts, and Vss is assumed to be ground. Transistor 320, operating as an enabling transistor, is normally active where Vdd is higher than the Vss ground potential such that a voltage level Vdd appears at node N33. Because the voltage level NREF, which is a voltage divided output derived from power supply voltage Vdd, is less than node N33 voltage of Vdd, transistor 322 is activated to place the Vdd voltage on the gate terminals of transistors 326 and 328. Assuming that enable signal ENA activates transistor 329, i.e., during programming of FPGA 18 and that NREF is sufficiently lower than Vpp to activate transistor 342 of unknown signaling voltage generator 34, transistor 328 is activated by input voltage Vdd. Based on the voltage level of input signal PREF, which is a voltage divided output derived from the input unknown signaling level Vpp, the voltage appearing at node N35 will be output as the comparator output signal Z. Comparator output signal Z will be clamped to a ground (Vss) potential through transistor 328 when PREF is greater (e.g., 5 V) than NREF, as transistor 324 is inactive. Comparator output signal Z will be set to Vdd through activation of transistor 324 when PREF is the same or less (e.g., 3.3 V or less) than NREF.

Where comparator output signal Z is clamped to Vss (i.e., when PREF is greater (e.g., 5 V) than NREF), the voltage identifying bit DET output from latching device 38 will be HIGH after passing through latch 382 and buffer/inverters 384 and 386. However, where comparator output signal Z is set to Vdd (i.e., when PREF is the same or less (e.g., 3.3 V or less) than NREF), the voltage identifying bit DET will be LOW. As noted above, the configurable I/O buffer can use this voltage identifying bit to configure its logic in order to interface properly with the electronic component at the detected signaling voltage level.

The use of transistors (many of which have gate terminals tied to drain or source terminals) in this FIG. 3 embodiment in lieu of the resistors used in the FIG. 2 embodiment improves the ability of the discriminator 10/12 to be immune from temperature, process, and other variations that may arise when the discriminator is manufactured and used in the field.

While the invention has been described in detail in connection with the best mode of the invention currently known, it should be readily understood that the invention is not limited to the specified embodiment described herein. Rather, the invention can be modified to incorporate any number of variations, alterations, substitutions or equivalent arrangements not heretofore described, which are commensurate with the spirit and scope of the invention. For example, Vdd may operate at any voltage level such as 1.8 volts, 2.5 volts, 3.3 volts, etc., whether or not Vpp is operating at the same or different voltage such as 5 volts. The invention may also be used to detect a signaling voltage range of an external electronic circuit from multiple signaling voltage ranges. The invention may be applied in situations where the power supply voltage of the external electronic circuit is one set voltage (e.g., 12 V) and the signaling voltage range varies in a range much lower than the power supply voltage (e.g., between 0 V→4 V).

Accordingly, the invention is not limited by the foregoing description, but is only limited by the scope of the appended claims.

What is claimed as new and desired to be protected by Letters Patent of the United States is:

1. An integrated circuit for adapting to different applied signals which transition in respective different signaling voltage ranges of a logic configurable device which configures its operating logic to support the given set of applied signals, the integrated circuit comprising:

a voltage detector for detecting a signal representing a signaling voltage range of a given set of applied signals, and outputting a voltage identification signal corresponding to the detected signaling voltage range;

wherein the logic configurable device configures its operating logic to support the given set of applied signals based on the voltage identification signal output from said voltage detector.

2. An integrated circuit as recited in claim 1, further comprising:

a first electronic circuit using the given set of applied signals and having a power supply whose highest voltage level represents an upper voltage level of the signaling voltage range of the given set of applied signals used in said first electronic circuit; and a second electronic circuit containing said voltage detector, wherein said voltage detector detects the highest voltage level of the power supply of said first electronic circuit and detects the signaling voltage range of the given set of applied signals based on detection of the highest voltage level of the power supply.

3. An integrated circuit as recited in claim 2, wherein said voltage detector further comprises an enable circuit for selectively enabling said voltage detector to detect the highest voltage level of the power supply of said first electronic circuit.

4. An integrated circuit as recited in claim 3, wherein the enable circuit comprises an enable signal generator for generating an enable signal for enabling said voltage detector for a predetermined period of time.

5. An integrated circuit as recited in claim 4, wherein said second electronic circuit is a programmable logic device; and wherein said enable signal generator enables detection of the highest voltage level of the power supply in said first electronic circuit only when said second electronic circuit is being programmed.

6. An electronic system for adapting to different applied signals which transition in respective different signaling voltage ranges, the electronic system comprising:

a voltage detector for detecting a signal representing a signaling voltage range of a given set of applied signals, and outputting a voltage identification signal corresponding to the detected signaling voltage range; and a logic configurable device which configures its operating logic to support the given set of applied signals based on the voltage identification signal output from said voltage detector.

7. An electronic system as recited in claim 6, further comprising:

a first electronic circuit using the given set of applied signals and having a power supply whose highest voltage level represents an upper voltage level of the signaling voltage range of the given set of applied signals used in said first electronic circuit; and a second electronic circuit containing said voltage detector, wherein said voltage detector detects the highest voltage level of the power supply of said first electronic circuit and detects the signaling voltage range of the given set of applied signals based on detection of the highest voltage level of the power supply.

8. An electronic system as recited in claim 7, wherein said logic configurable device is a buffer for receiving the given set of applied signals as signals output from said first electronic circuit.

9. An electronic system as recited in claim 7, wherein said logic configurable device is a buffer for transmitting the given set of applied signals to said first electronic circuit.

10. An electronic system as recited in claim 7, wherein said logic configurable device is an input/output buffer for receiving and transmitting the given set of applied signals from and to said first electronic circuit.

11. An electronic system as recited in claim 7, wherein said voltage detector further comprises an enable circuit for selectively enabling said voltage detector to detect the highest voltage level of the power supply of said first electronic circuit.

12. An electronic system as recited in claim 11, wherein the enable circuit comprises an enable signal generator for generating an enable signal for enabling said voltage detector for a predetermined period of time.

13. An electronic system as recited in claim 12, wherein said second electronic circuit is a programmable logic device; and wherein said enable signal generator enables detection of the highest voltage level of the power supply in said first electronic circuit only when said second electronic circuit is being programmed.

14. An electronic system as recited in claim 6, wherein the voltage identification signal is a voltage identification bit that identifies one of two different signaling voltage ranges for the given set of applied signals; and wherein said logic configurable device configures its logic to be compatible with a first signaling voltage range when the voltage identification bit is in one of a HIGH state and a LOW state, and wherein said logic configurable device configures its logic to be compatible with a second signaling voltage range when the voltage identification bit is in the other of said HIGH state and LOW state.

15. An electronic system as recited in claim 7, further comprising a voltage reference generator for providing a reference voltage used by said voltage detector in detecting the signaling voltage range used in said first electronic circuit.

16. An electronic system as recited in claim 15, wherein said voltage reference generator comprises a voltage divider network which derives the reference voltage from a supply voltage used to power said second electronic circuit.

17. An electronic system as recited in claim 16, further comprising a signaling voltage level generator for generating a signaling voltage level corresponding to the signaling voltage range of the given set of applied signals.

18. An electronic system as recited in claim 17, wherein said voltage detector detects the signaling voltage range of the applied signals by comparing the reference voltage output from said voltage reference generator with the signaling voltage level output from said signaling voltage level generator.

19. An electronic system as recited in claim 18, wherein said voltage detector contains a first P-channel transistor having a gate terminal receiving the reference voltage output from said voltage reference generator, and a second P-channel transistor having a gate terminal receiving the signaling voltage level from said signaling voltage level generator;

wherein the first P-channel transistor is coupled in series to a first N-channel transistor, and the second P-channel transistor is coupled in series to a second N-channel transistor, wherein drains of the first P-channel and N-channel transistors are coupled together with gates of the first and second N-channel transistors;

wherein source terminals of the first and second P-channel transistors are coupled to a voltage Vdd, and source terminals of the first and second N-channel transistors are coupled to a voltage Vss; and wherein an output node formed by connection of drains of the second P-channel transistor and the second N-channel transistor carries an output voltage signal which is substantially equal to voltage Vss when the signaling voltage level is greater than the reference voltage, and is substantially equal to voltage Vdd when the signaling voltage level is not greater than the reference voltage, the output voltage signal being output by said voltage detector as the voltage identification signal corresponding to the detected signaling voltage range of the applied signals.

20. An electronic system as recited in claim 16, wherein the voltage divider network comprises a series connection of four resistors, wherein first and second resistors are coupled together at one end to form an output node from which the reference voltage is derived.

21. An electronic system as recited in claim 16, wherein the voltage divider network of said voltage reference generator comprises a series connection of a resistor, a P-channel transistor, and an N-channel transistor, wherein gate terminals of the P-channel and N-channel transistors are coupled their respective drain terminals, and one end of the resistor is connected to a source terminal of the P-channel transistor to form an output node from which the reference voltage is derived.

22. An electronic system as recited in claim 17, wherein said signaling voltage level generator comprises a series connection of four resistors, wherein first and second resistors are coupled together at one end to form an output node from which the signaling voltage level is generated.

23. An electronic system as recited in claim 17, wherein said signaling voltage level generator comprises a series connection of a P-channel transistor, an enabling transistor, a resistor and an N-channel transistor, wherein gate terminals of the P-channel and N-channel transistors are coupled their respective drain terminals, and wherein a drain terminal of the enabling transistor and one end of the resistor are connected to form an output node from which the signaling voltage level is generated.

24. A system for adapting to different applied signals which transition in respective different signaling voltage ranges, the system comprising:
an integrated circuit having a voltage detector for detecting a signal representing a signaling voltage range of a given set of applied signals, and outputting a voltage identification signal corresponding to the detected signaling voltage range; and
a logic configurable device which configures its operating logic to support the given set of applied signals based on the voltage identification signal output from the voltage detector.

25. A system as recited in claim 24, further comprising:
a first electronic circuit using the given set of applied signals and having a power supply whose highest voltage level represents an upper voltage level of the signaling voltage range of the given set of applied signals used in said first electronic circuit; and
a second electronic circuit containing said integrated circuit having the voltage detector, wherein the voltage detector detects the highest voltage level of the power supply of said first electronic circuit and detects the signaling voltage range of the given set of applied signals based on detection of the highest voltage level of the power supply.

26. A system as recited in claim 25, wherein the voltage detector further comprises an enable circuit for selectively enabling the voltage detector to detect the highest voltage level of the power supply of said first electronic circuit.

27. A system as recited in claim 26, wherein the enable circuit comprises an enable signal generator for generating an enable signal for enabling the voltage detector for a predetermined period of time.

28. A system as recited in claim 27, wherein said second electronic circuit is a programmable logic device; and
wherein said enable signal generator enables detection of the highest voltage level of the power supply in said first electronic circuit only when said second electronic circuit is being programmed.

29. A method of adapting to different applied signals which transition in respective different signaling voltage ranges, the method comprising the steps of:
detecting a signaling voltage range of a given set of applied signals;
outputting a voltage identification signal corresponding to the detected signaling voltage range; and
configuring operating logic in a logic configurable device to support the given set of applied signals based on the voltage identification signal output in said outputting step.

30. A method as recited in claim 29, wherein said step of detecting a signaling voltage range further comprises the steps of:
detecting the highest voltage level of a power supply of a first electronic circuit; and
detecting the signaling voltage range of the given set of applied signals based on detection of the highest voltage level of the power supply.

31. A method as recited in claim 30, wherein said step of detecting a signaling voltage range further comprises the step of selectively enabling said detecting step for a predetermined period of time.

32. A method as recited in claim 31, wherein said step of detecting a signaling voltage range is performed on a programmable logic device; and
wherein said selectively enabling step enables said step of detecting a signaling voltage range only when the programmable logic device is being programmed.

33. A method as recited in claim 32, wherein said step of detecting a signaling voltage range is performed on a field programmable gate array (FPGA); and
wherein said selectively enabling step enables said step of detecting a signaling voltage range only when the FPGA is being programmed.

34. A method as recited in claim 29, further comprising the steps of:
providing a reference voltage used by said step of detecting a signaling voltage range for detecting the signaling voltage range of the given set of applied signals; and
generating a signaling voltage level corresponding to the signaling voltage range of the given set of applied signals.

35. A method as recited in claim 34, wherein said step of detecting a signaling voltage range comprises the step of detecting the signaling voltage range of the applied signals by comparing the reference voltage output from said providing step with the signaling voltage level output from said generating step.

* * * * *